United States Patent
Tsai et al.

(10) Patent No.: US 9,922,969 B1
(45) Date of Patent: Mar. 20, 2018

(54) INTEGRATED CIRCUITS HAVING TRANSISTORS WITH HIGH HOLDING VOLTAGE AND METHODS OF PRODUCING THE SAME

(71) Applicant: Globalfoundries Singapore Pte. Ltd., Singapore (SG)

(72) Inventors: Tsung-Che Tsai, Singapore (SG); Vaddagere Nagaraju Vasantha Kumar, Singapore (SG); Wei Gao, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/271,560

(22) Filed: Sep. 21, 2016

(51) Int. Cl.
  *H01L 23/62* (2006.01)
  *H01L 27/02* (2006.01)
  *H01L 29/78* (2006.01)

(52) U.S. Cl.
  CPC ...... *H01L 27/0274* (2013.01); *H01L 29/7839* (2013.01)

(58) Field of Classification Search
  USPC ......... 257/350–356, 213, 288; 331/116, 117; 438/197, 92
  See application file for complete search history.

(56) References Cited

U.S. PATENT DOCUMENTS

| | | | |
|---|---|---|---|
| 2005/0139860 A1* | 6/2005 | Snyder | H01L 29/0653 257/155 |
| 2007/0080406 A1* | 4/2007 | Snyder | H01L 21/823814 257/369 |
| 2014/0302644 A1* | 10/2014 | Luo | H01L 29/6659 438/151 |
| 2015/0021732 A1* | 1/2015 | Kanai | H01L 27/0629 257/476 |
| 2015/0206942 A1* | 7/2015 | Glass | H01L 29/66795 257/335 |

* cited by examiner

Primary Examiner — Tram H Nguyen
(74) Attorney, Agent, or Firm — Lorenz & Kopf, LLP

(57) ABSTRACT

Integrated circuits and methods of producing the same are provided. In an exemplary embodiment, an integrated circuit includes a substrate and a source in electrical communication with the substrate. A drain is also in electrical communication with the substrate. A gate overlies the substrate between the source and the drain, wherein a channel is defined within the substrate directly underlying the gate, and where a Schottky portion of the substrate is positioned between the channel and the source.

19 Claims, 6 Drawing Sheets

INTEGRATED CIRCUITS HAVING TRANSISTORS WITH HIGH HOLDING VOLTAGE AND METHODS OF PRODUCING THE SAME

TECHNICAL FIELD

The technical field generally relates to integrated circuits having transistors with high holding voltages and methods of producing the same, and more particularly relates to integrated circuits with transistors having Schottky barriers that increase the holding voltage, and methods of producing the same.

BACKGROUND

Integrated circuits often include a plurality of pins that are used to make electrical connections to components beyond the integrated circuit, such as a power pin for supplying power, a ground pin for grounding purposes, and a signal pin. Exemplary signal pins include an input signal pin for supplying an external signal to the integrated circuit and an output signal pin for outputting a signal from the integrated circuit. Typically, a gate grounded transistor is electrically connected between different pins for electrostatic discharge protection, so an integrated circuit with three pins would have at least three gate grounded transistors electrically connected between the pins. These gate grounded transistors discharge excess voltage that may arise due to an electrostatic discharge or other types of electrical noise.

The gate grounded transistor has a holding voltage that is an inherent feature of the transistor, where the "holding voltage" is the minimum voltage that must be applied for an electronic device to remain in the "on" state. Many typical gate grounded transistors have a holding voltage of about 6 volts, but other designs may have other holding voltages. The holding voltage should be at or above the operating voltage for the integrated circuit to prevent undesirable trips of the gate grounded transistor. For example, if the operating voltage of an integrated circuit was 6 volts, minor voltage variations over time (i.e. "noise") could frequently trip the gate grounded transistor with a holding voltage of 6 volts because there is essentially no safety margin between the holding voltage and the operating voltage. Furthermore, the designed operating voltage may be limited by the holding voltage of gate grounded transistors used for electrostatic discharge protection.

Accordingly, it is desirable to provide integrated circuits with transistors that have higher holding voltages than traditional transistors, where these transistors may be used for electrostatic discharge protection, and methods of producing the same. In addition, it is desirable to develop transistors for electrostatic discharge protection that do not increase the manufacturing processes needed to produce an integrated circuit. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a substrate and a source in electrical communication with the substrate. A drain is also in electrical communication with the substrate. A gate overlies the substrate between the source and the drain, wherein a channel is defined within the substrate directly underlying the gate, and where a Schottky portion of the substrate is positioned between the channel and the source.

An integrated circuit is provided in another embodiment. The integrated circuit includes a substrate and a source in electrical communication with the substrate. A drain is also in electrical communication with the substrate, where a source to drain length is measured from the source to the drain. A gate overlies the substrate, and two spacers are adjacent to opposite sides of the gate. A channel is defined within the substrate directly underlying the gate and the two spacers, where the channel has a channel length that is less than the source to drain length.

A method of producing an integrated circuit is provided in yet another embodiment. The method includes forming a gate overlying a substrate, and forming a source and a drain within the substrate on opposite sides of the gate where a Schottky portion of the substrate is positioned between the gate and the source. A Schottky barrier is formed at the Schottky portion of the substrate.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
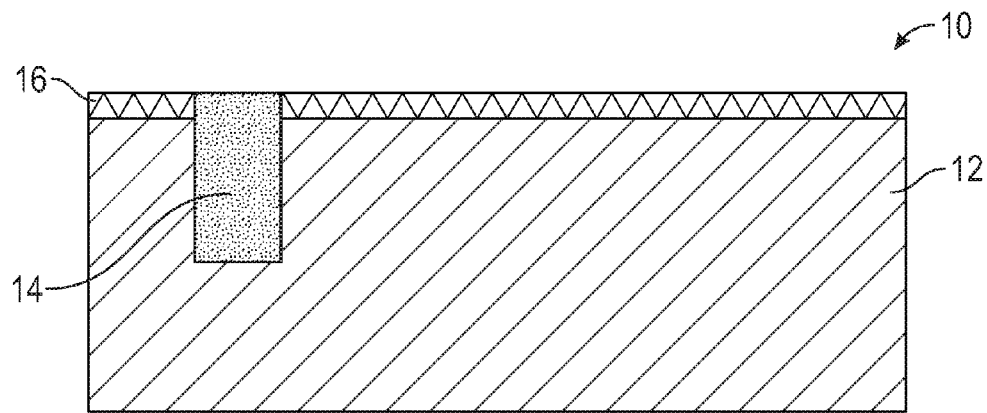
FIGS. 1-11 illustrate, in cross sectional views, an integrated circuit and methods for fabricating the same in accordance with exemplary embodiments, where a portion of FIG. 11 includes an electrical schematic to illustrate an embodiment of electrical connections.

Reference is made to an exemplary embodiment illustrated in FIG. 1. An integrated circuit 10 has a substrate 12 that includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least 10 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer. In an exemplary embodiment, the substrate 12 has a planar surface, as illustrated.

A shallow trench isolation structure 14 may be positioned within the substrate 12, where the shallow trench isolation structure 14 is an electrical insulator. As used herein, an "electrically insulating material" or an "electrical insulator" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from more than about $1 \times 10^{-4}$ ohm meters to less than about $1 \times 10^4$ ohm meters. In an exemplary embodiment the shallow trench isolation structure 14 includes silicon dioxide, but other electrically insulating materials may be present in alternate embodiments. A surface dielectric layer 16 may overlie the substrate 12 in some embodiments, where the surface dielectric layer 16 includes silicon dioxide in an exemplary embodiment but may include other materials in alternate embodiments. As used herein, the term "overlying" means "over" such that an intervening layer may lie between the surface dielectric layer 16 and the substrate 12, or "on" such that the surface dielectric layer 16 physically contacts the substrate 12. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the substrate 12.

Figure 2:
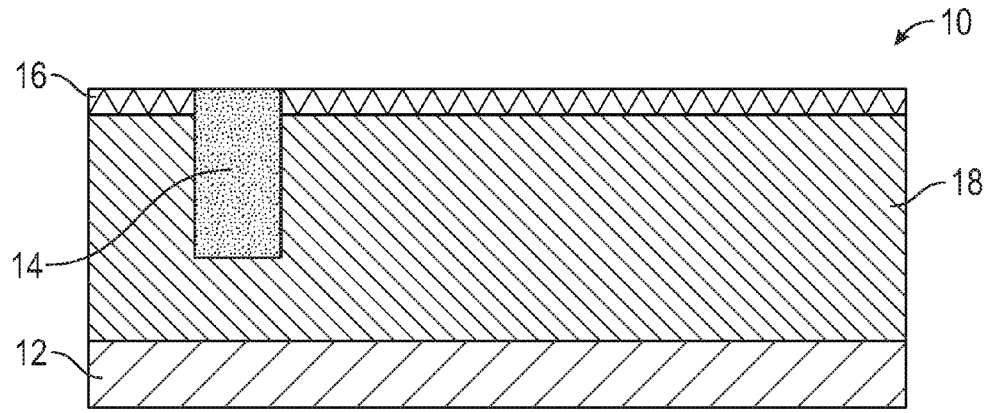

Referring to the exemplary embodiment in FIG. 2, a base well 18 is formed in the substrate 12. The base well 18 may be formed by implanting conductivity determining impurities. The conductivity determining impurities may be implanted into the base well 18 at a base well concentration, such as a base well concentration of from about $1 \times 10^{14}$ to about $1 \times 10^{16}$ per cubic centimeter, but other concentrations are also possible. The conductivity determining impurities may be implanted as ions under the influence of an electrical field. In an exemplary embodiment, the conductivity imparting impurities are "P" type conductivity determining impurities, where "P" type conductivity determining impurities primarily include boron, aluminum, gallium, and indium, but other materials could also be used in alternate embodiments. "N" type conductivity determining impurities may be implanted in an alternate embodiment, where "N" type conductivity determining impurities primarily include phosphorous, arsenic, and/or antimony, but other materials could also be used.

Figure 3:
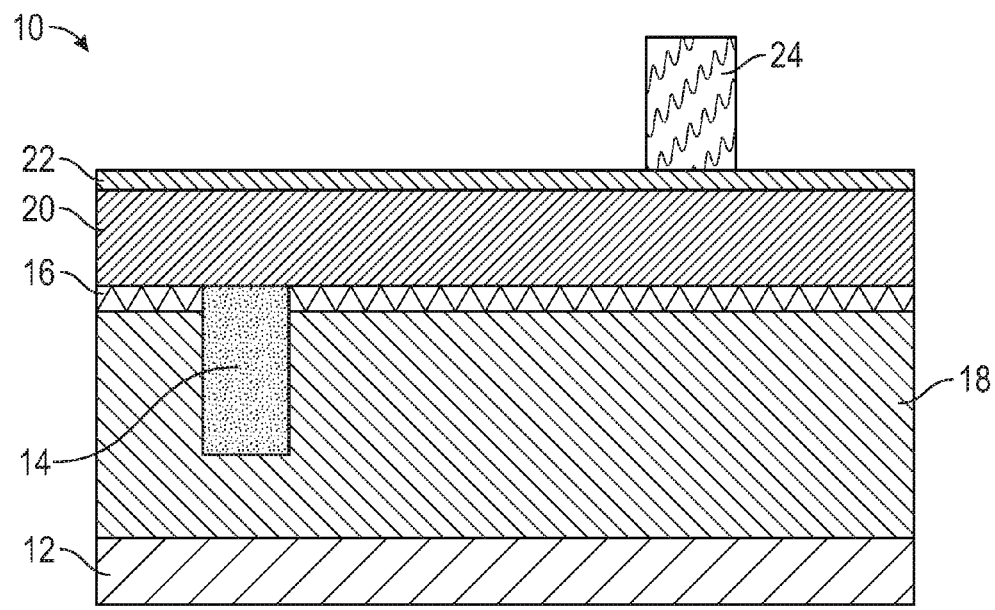

A gate layer 20 and a gate mask layer 22 may be formed overlying the substrate 12, as illustrated in an embodiment in FIG. 3. The gate layer 20 may include polysilicon, which can be formed by low pressure chemical vapor deposition using silane, but other deposition techniques or materials may be used in alternate embodiments. The gate mask layer 22 may be formed overlying the gate layer 20, where the gate mask layer 22 includes silicon nitride in an exemplary embodiment. Silicon nitride can be formed by low pressure chemical vapor deposition using ammonia and dichlorosilane, but other materials or other deposition techniques may be used in alternate embodiments. A gate photoresist layer 24 may be formed and patterned overlying the gate mask layer 22. The gate photoresist layer 24 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the gate photoresist layer 24 remains overlying the other areas of the gate mask layer 22 and the gate layer 20. The gate photoresist layer 24 (and other photoresist layers described below) may optionally include a top and/or bottom anti-reflective coating (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning.

Figure 4:
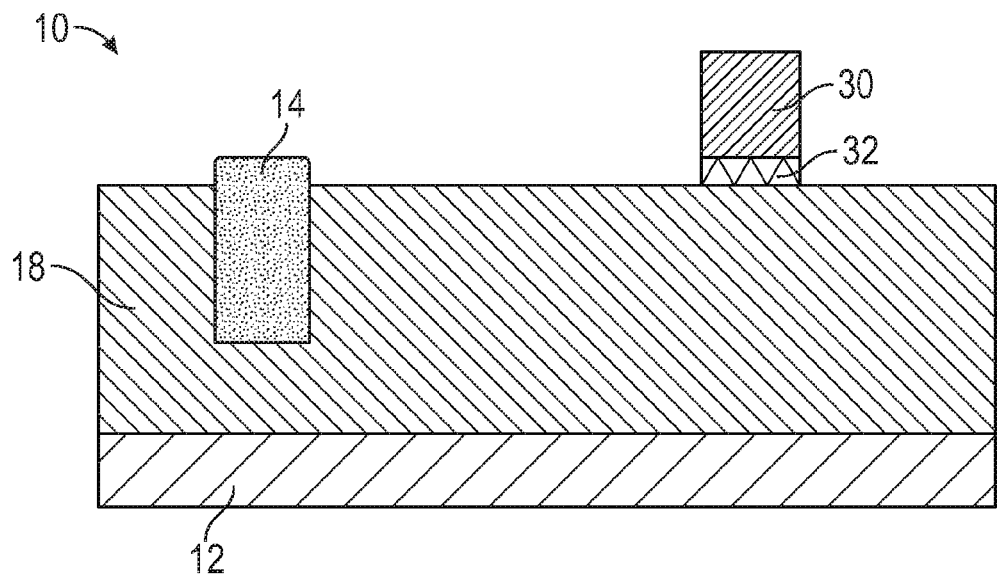

Reference is made to an embodiment illustrated in FIG. 4, with continuing reference to FIG. 3. The gate mask layer 22, the gate layer 20, and the surface dielectric layer 16 that are not covered by the patterned gate photoresist layer 24 may be removed to form a gate 30 and a gate dielectric 32. In an embodiment where the gate mask layer 22 primarily includes silicon nitride, the exposed portions can be removed with a wet etch using hot phosphoric acid where the remaining portions are used to shield underlying materials for subsequent etchings. The exposed portions of the gate layer 20 may be removed with a reactive ion etch using hydrogen bromide for a gate layer 20 primarily including polysilicon, and the surface dielectric layer 16 may be removed with a wet etch using dilute hydrofluoric acid for embodiments where the surface dielectric layer 16 primarily includes silicon dioxide. However, many etchant techniques and materials are available, so other techniques and/or materials may be used in alternate embodiments. In an embodiment, the remaining gate photoresist layer 24 is removed with an oxygen containing plasma, and the remaining gate mask layer 22 is removed with a wet etch using hot phosphoric acid, but other etchants can be used in alternate embodiments.

Figure 5:
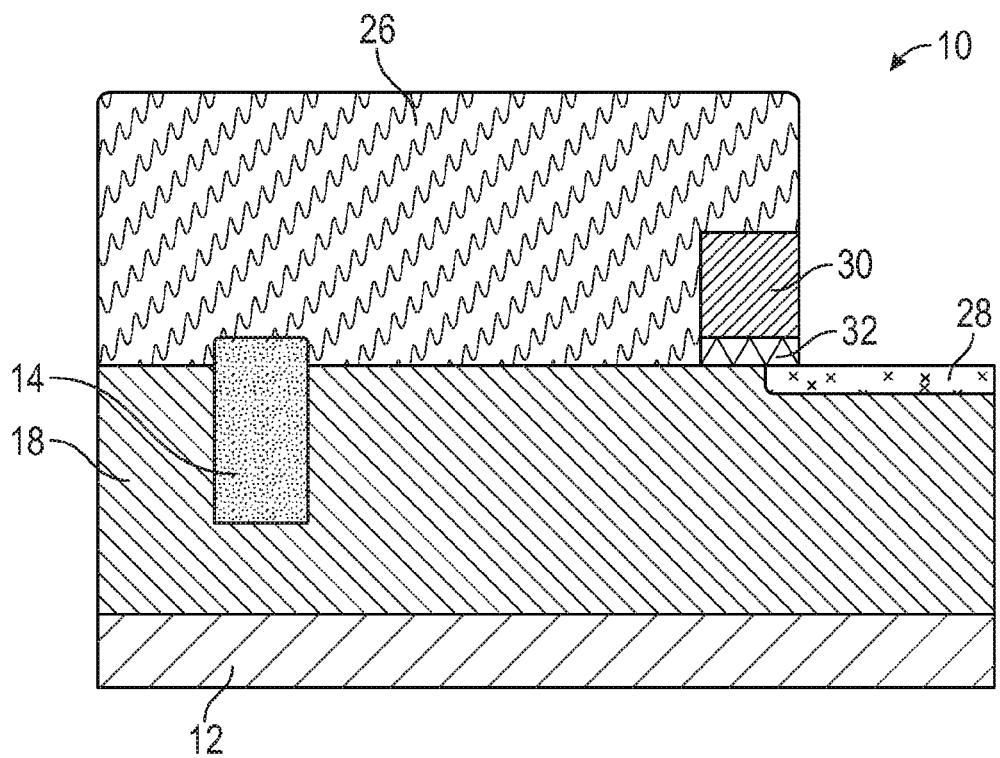

Referring to an exemplary embodiment in FIG. 5, an extension photoresist layer 26 is formed and patterned overlying a portion of the substrate 12. The substrate 12 directly adjacent to one side of the gate 30 is exposed and the substrate 12 directly adjacent to the opposite side of the gate 30 is covered by the extension photoresist layer 26. Conductivity determining impurities may be implanted into the exposed substrate 12 to form a drain extension 28, where a portion of the gate 30 may directly overlie a portion of the drain extension 28. Ion implantation may be used to form the drain extension 28, and the implantation process may result in some ions travelling into the substrate 12 and under adjacent structures, such as the gate 30 in an exemplary embodiment.

Figure 6:
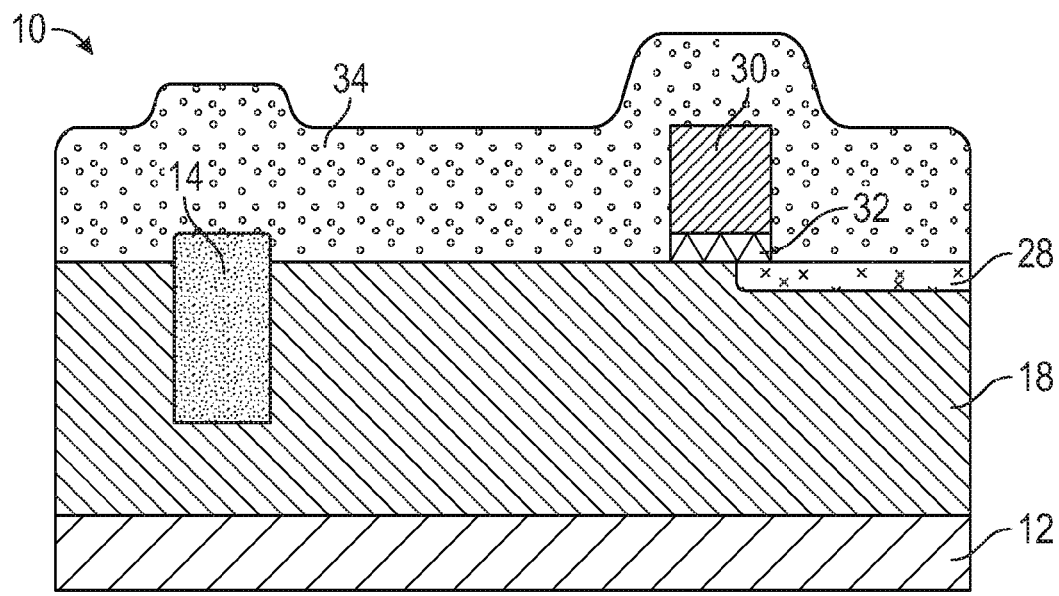
Figure 7:
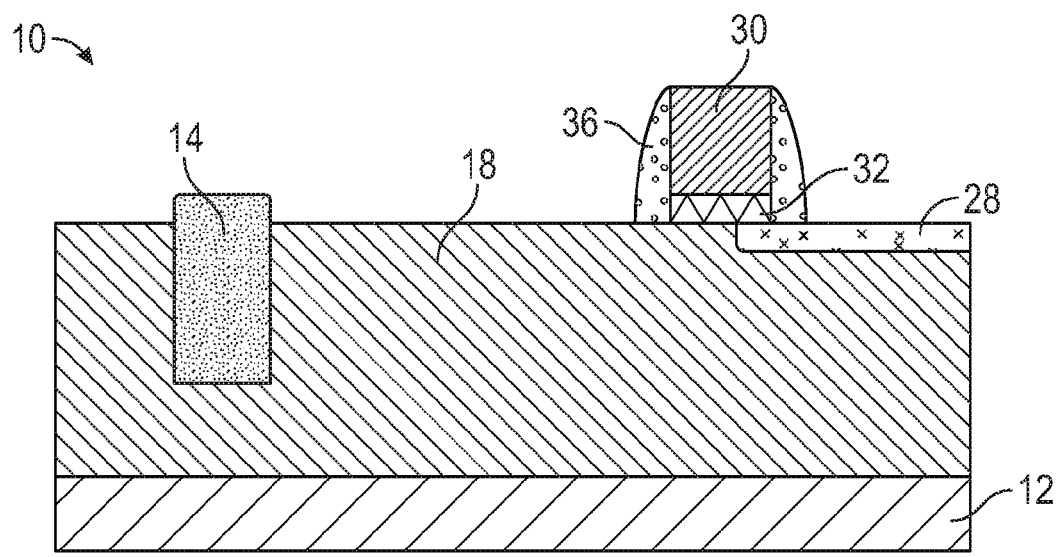

A spacer layer 34 may be formed overlying the gate 30 and the substrate 12 in an exemplary embodiment illustrated in FIG. 6. The spacer layer 34 may include silicon nitride in an exemplary embodiment, but other electrically insulating materials may be used in alternate embodiments. The horizontal portions of the spacer layer 34 may be removed with an anisotropic etch to leave two spacers 36 adjacent to opposite side surfaces of the gate 30 and the gate dielectric 32, as illustrated in FIG. 7 with continuing reference to FIG. 6. A dry plasma etch with hydrogen and nitrogen trifluoride may be used, but other etch techniques or materials are also possible. The anisotropic etch is stopped when the horizontal portions of the spacer layer 34 (the portions that are parallel with the surface of the substrate 12) are removed, but before the vertical portions adjacent to the gate 30 are removed.

Figure 8:
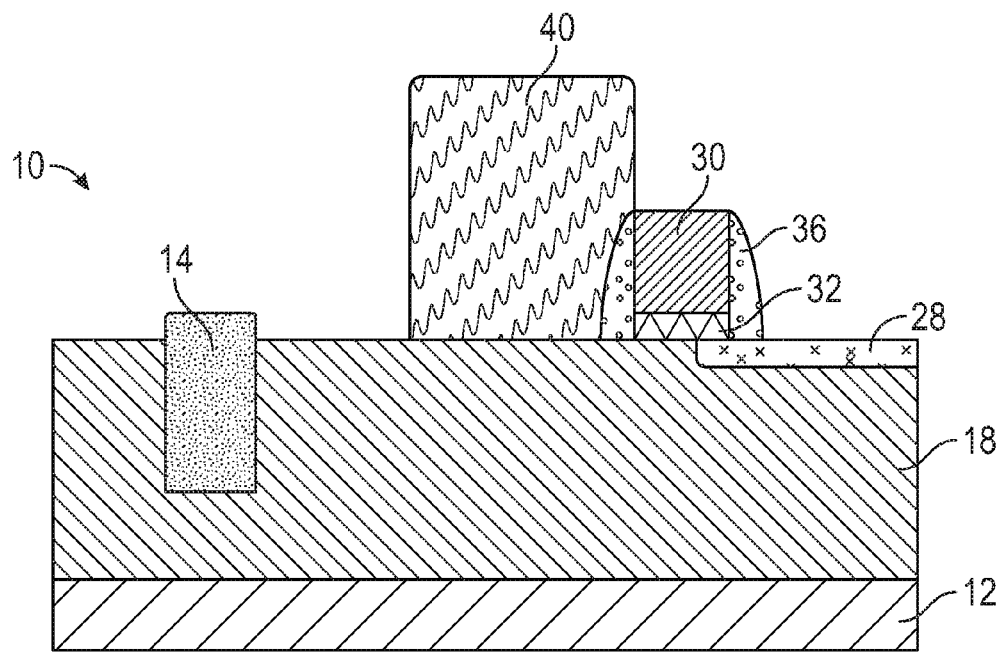

Referring to an exemplary embodiment illustrated in FIG. 8, a Schottky photoresist layer 40 is formed and patterned to overlay a portion of the substrate 12 adjacent to the gate 30 and the spacer 36. The Schottky photoresist layer 40 may be the same photoresist layer used for other manufacturing processes, such as isolation of "P" type transistors during source/drain dopant implantation. As such, the Schottky photoresist layer 40 may not require an additional manufacturing process over standard complementary metal oxide semiconductor (CMOS) manufacturing techniques. The Schottky photoresist layer 40 is used to form a Schottky area, as described below, hence the use of the term "Schottky." A Schottky barrier is a potential energy barrier formed at the junction between a metal and a semiconductor. Schottky barriers have rectifying characteristics, and may be used as diodes in some cases.

Figure 9:
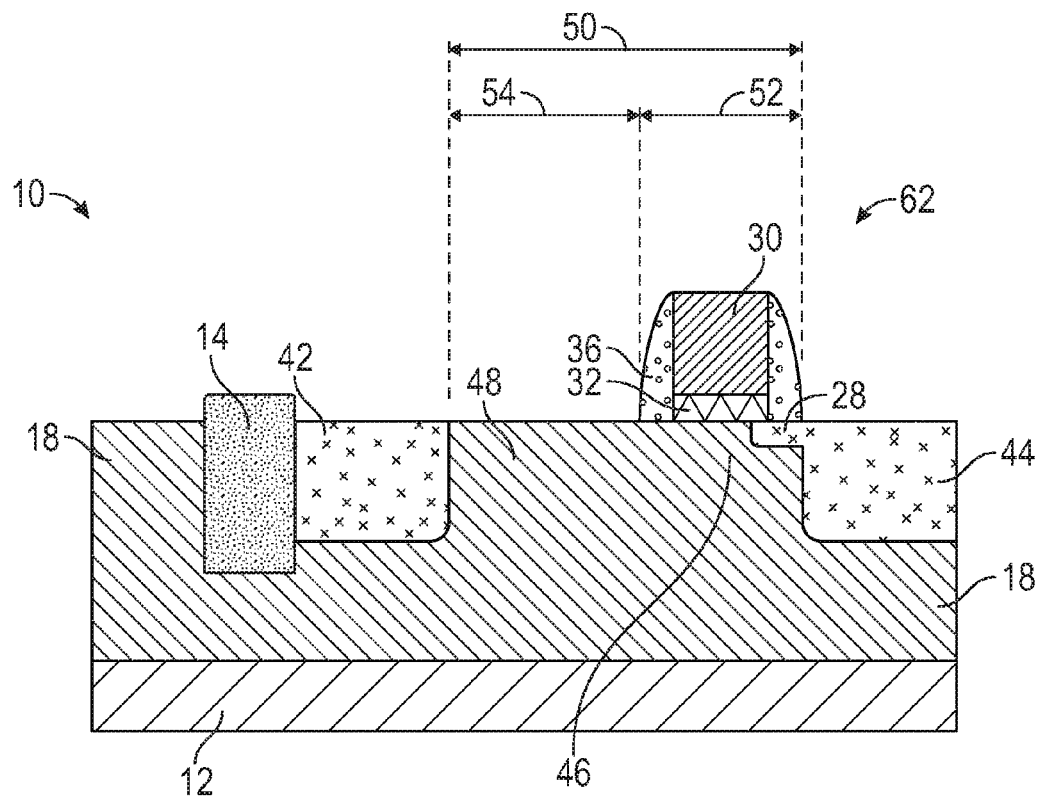

A source 42 and a drain 44 may be formed in the substrate 12 by implantation of conductivity determining impurities, as illustrated in FIG. 9 with continuing reference to FIG. 8. The source 42 and drain 44 may include "N" type conductivity determining impurities in an exemplary embodiment, but the source 42 and drain 44 may also include "P" type conductivity determining impurities in an alternate embodiment. The drain extension 28 is in electrical communication with the drain 44, and may physically contact the drain 44, but the drain 44 does not directly underlie the gate 30. In an alternate embodiment (not illustrated), the source 42 and/or drain 44 may be formed in electrical communication with the substrate 12 without being formed within the substrate 12, but the source 42 and drain 44 are in electrical communication with the substrate 12. The term "electrical communication," as used herein, means electrical current is capable of flowing from one component to another, where the electrical current may or may not flow through an electrically conductive intervening component. The term "direct electrical contact," as used herein, means direct physical contact between components that are electrically conductive or semiconductors, but not electrical insulators. The conductivity imparting impurities are implanted into the drain 44 directly adjacent to the spacer 36 and the gate, but a Schottky portion 48 of the substrate 12 separates the source 42 from the spacer 36 and the gate 30. The Schottky portion 48 of the substrate 12 is a portion of the substrate 12 that is between the source 42 and the drain 44 but does not directly underlie the gate 30 or the spacer 36.

A channel 46 is defined within the substrate 12 between the source 42 and the drain 44, where the channel 46 directly underlies the gate 30 and the spacers 36 (in embodiments where spacers 36 are present). An ESD transistor 62 includes the gate 30, the source 42, the drain 44, and the channel 46. The Schottky portion 48 of the substrate 12 is positioned between the source 42 and the gate 30, as described above, so the gate 30 does not directly overlie the Schottky portion 48 of the substrate 12. The spacers 36 also do not directly overlie the Schottky portion 48 of the substrate 12, in embodiments where spacers 36 are present. The Schottky portion 48 and the substrate 12 include conductivity imparting impurities at a concentration that is less than that of the source 42 and/or drain 44. The Schottky portion 48 and the substrate 12 may be defined within the base well 18, so the Schottky portion 48 and the substrate 12 may include conductivity imparting impurities at about the same concentration as in the base well 18. The source 42, the drain 44, the channel 46, and the base well 18 are all in electrical communication.

The integrated circuit 10 has a source to drain length 50 measured from the source 42 to the drain 44, and the channel 46 has a channel length 52 extending from a side of the spacer 36 directly adjacent to the drain 44 to the opposite side of the other spacer 36 that is adjacent to the Schottky portion 48 of the substrate 12. As such, the channel length 52 includes the length of the gate 30 and the two adjacent spacers 36, or the channel length 52 includes the length of only the gate 30 in embodiments where no spacers 36 are present. The channel length 52 is less than the source to drain length 50. The Schottky portion 48 of the substrate 12 has a Schottky length 54 extending from the source 42 to the edge of the closest spacer 36, or to the edge of the gate 30 in embodiments without a spacer 36. In an exemplary embodiment, the Schottky length 54 is from about 0.1 to about 0.5 micrometers, but other Schottky lengths 54 are also possible in alternate embodiments. The source to drain length 50 is about the sum of the channel length 52 and the Schottky length 54. The Schottky portion 48 of the substrate 12 separates the source 42 from the gate 30 and the spacer 36.

Figure 10:
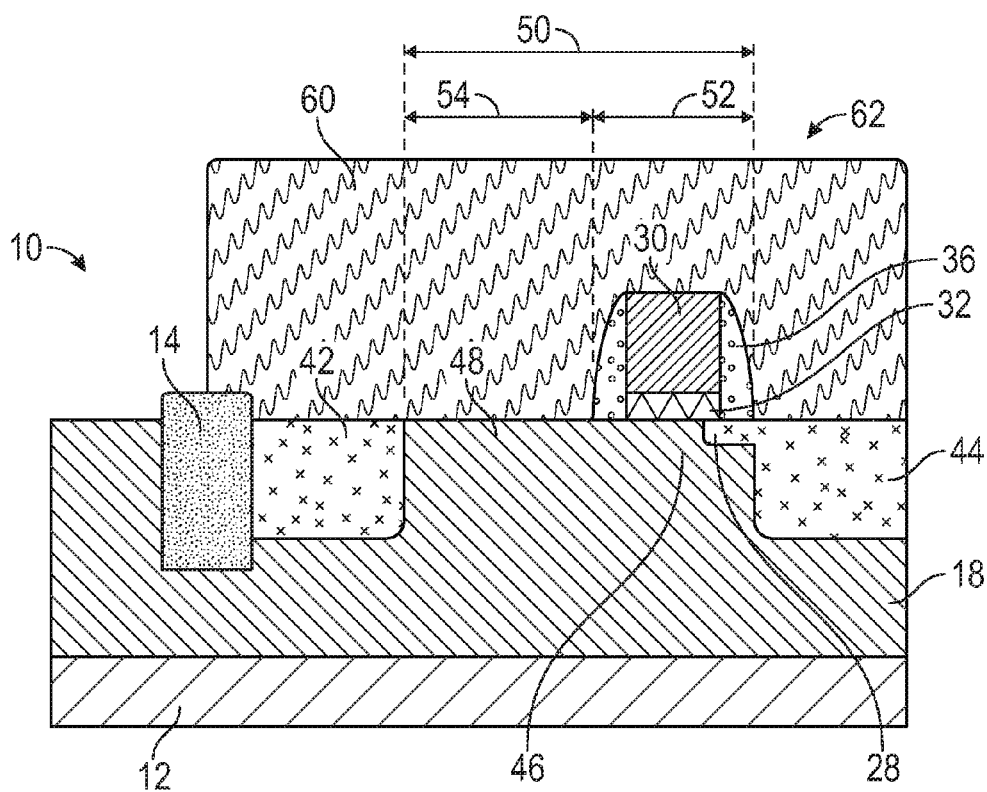
Figure 11:
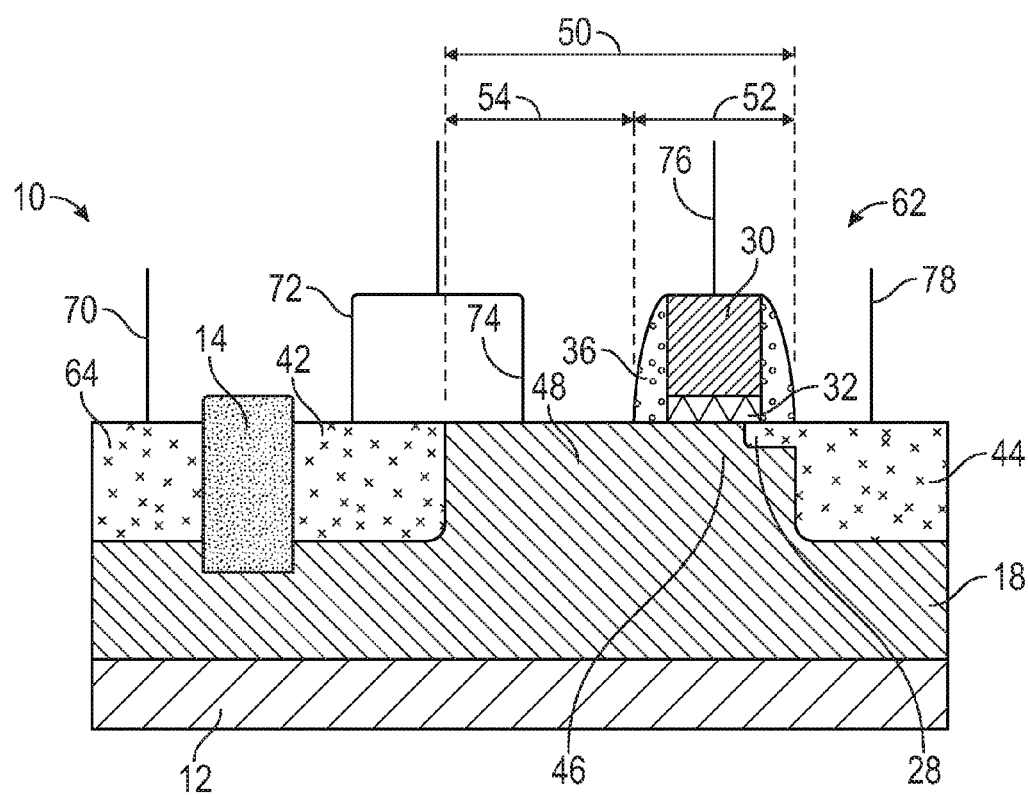

Referring to an exemplary embodiment illustrated in FIG. 10, a ground photoresist layer 60 is formed and patterned overlying the source 42, the drain 44, the Schottky portion 48, and the gate 30. The ground photoresist layer 60 is patterned to expose a portion of the base well 18 on an opposite side of the shallow trench isolation structure 14 from the source 42. Referring to FIG. 11 with continuing reference to FIG. 10, a ground region 64 is formed within the substrate 12 and the base well 18 by implanting conductivity determining impurities. The conductivity determining impurities within the ground region 64 may be the opposite type as in the source 42 and drain 44, so in an exemplary embodiment the ground region 64 may include "P" type conductivity determining impurities when the source 42 and drain 44 include "N" type conductivity determining impurities. The ground region 64 is in electrical communication with the ESD transistor 62 through the base well 18 in an exemplary embodiment.

A plurality of contacts may be formed, where the contacts are illustrated in schematic form in FIG. 11. The contacts may include a ground contact 70, a source contact 72, a Schottky contact 74, a gate contact 76, and a drain contact 78, where the contacts are in electrical communication with the ground region 64, the source 42, the Schottky portion 48, the gate 30, and the drain 44, respectively. Some of the contacts listed above may not be present in all embodiments, and there may be a plurality of some of the contacts listed above in some embodiments.

The source contact 72 and the Schottky contact 74 are in electrical communication, and it may even be possible to utilize a single contact in electrical communication with both the source 42 and the Schottky portion 48 of the substrate 12 in some embodiments. However, reference to the Schottky contact 74 and the source contact 72 together indicates at least two different contacts are present for the source 42 and the Schottky portion 48 of the substrate 12. The Schottky portion 48 of the substrate 12 is a semiconductor, and the Schottky contact 74 (and the other contacts described herein) is a conductive material such as a metal, so a Schottky barrier is formed in embodiments where the Schottky contact 74 directly contacts the Schottky portion 48 of the substrate 12. A silicide (not illustrated) may be formed on the surface of the Schottky portion 48 in some embodiments, but the silicide has a high conductivity and a Schottky barrier is still formed in embodiments with a silicide on the surface of the Schottky portion 48. The silicide, if present, may directly contact the Schottky contact 74 such that the Schottky portion 48 is in electrical communication with the Schottky contact 74. This Schottky barrier may drain excess current when the ESD transistor 62 is tripped, and this may increase the holding voltage of the ESD transistor 62 over similar transistors that do not include a Schottky portion 48 of the substrate 12.

Figure 12:
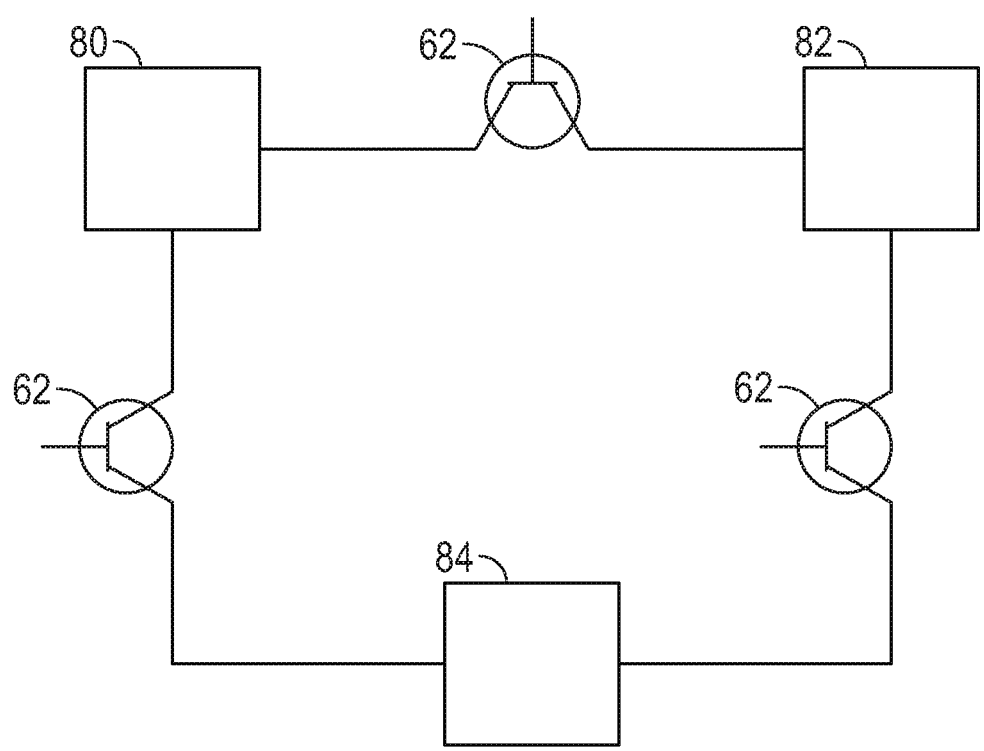
FIG. 12 is an electrical schematic of an embodiment of a portion of an integrated circuit.

Reference is made to an exemplary embodiment illustrated in FIG. 12, with continuing reference to FIG. 11, where FIG. 12 is a schematic type figure. The integrated circuit 10 includes a plurality of pins, such as a first pin 80, a second pin 82, and a third pin 84, and the integrated circuit 10 may include additional pins in some embodiments. In an exemplary embodiment, the first pin 80, the second pin 82, and the third pin 84 are selected from a power pin, a ground pin, and a signal pin, but other embodiments are also possible. An ESD transistor 62 is electrically connected between each pin, so an ESD transistor 62 is electrically connected between the first and second pins 80, 82, another ESD transistor 62 is electrically connected between the second and third pins 82, 84, and yet another ESD transistor 62 is electrically connected between the third and first pins 84, 80. For an ESD transistor 62 electrically connected between the first and second pins 80, 82, the source 42 of the ESD transistor 62 is connected to one of the pins, such as the first pin 80, and the drain 44 of the ESD transistor 62 is connected to the other pin, such as the second pin 82. Similar connections for the other ESD transistors 62 are also utilized. In some embodiments, different types of pins are connected to an individual ESD transistor 62, but two pins of the same type may be connected to an individual ESD transistor 62 in other embodiments. The higher holding voltage of the ESD transistors 62 may allow for fewer unintended trips of the ESD transistor 62, or it may allow for a higher operating voltage for the integrated circuit 10.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a substrate;
   a source in electrical communication with the substrate;
   a drain in electrical communication with the substrate;
   a gate overlying the substrate between the source and the drain, wherein a channel is defined within the substrate directly underlying the gate, and wherein a Schottky portion of the substrate is positioned between the channel and the source;
   a base well defined within the substrate, wherein the channel is defined within the base well; and
   a ground contact electrically connected to the base well.

2. The integrated circuit of claim 1 wherein the Schottky portion of the substrate is from about 0.1 to about 0.5 microns.

3. The integrated circuit of claim 1 wherein the Schottky portion of the substrate is defined within the base well.

4. The integrated circuit of claim 1 further comprising:
   a source contact in electrical communication with the source; and
   a Schottky contact in electrical communication with the Schottky portion, wherein the source contact and the Schottky contact are in electrical communication.

5. The integrated circuit of claim 1 further comprising:
   two spacers adjacent to the gate, wherein the gate and the two spacers directly overlie the channel.

6. The integrated circuit of claim 1 wherein:
   the substrate comprises a planar surface, and the gate overlies the planar surface.

7. The integrated circuit of claim 1 further comprising:
   a Schottky contact in electrical communication with the Schottky portion.

8. The integrated circuit of claim 1 wherein the source comprises N type conductivity determining impurities and the drain comprises N type conductivity determining impurities.

9. The integrated circuit of claim 1 further comprising:
   a first pin electrically connected to the source;
   a second pin electrically connected to the drain.

10. The integrated circuit of claim 9 wherein the first pin is selected from a power pin, a ground pin, and a signal pin.

11. The integrated circuit of claim 10 wherein the second pin is selected from the power pin, the ground pin, and the signal pin, and wherein the first pin and the second pin are different from each other.

12. An integrated circuit comprising:
    a substrate;
    a source in electrical communication with the substrate;
    a drain in electrical communication with the substrate; a gate overlying the substrate between the source and the drain, wherein a channel is defined within the substrate directly underlying the gate, and wherein a Schottky portion of the substrate is positioned between the channel and the source;
    wherein the source comprises N type conductivity determining impurities and the drain comprises N type conductivity determining impurities; and
    a first pin; and a second pin, wherein the first pin and the second pin are electrically connected by an ESD transistor, wherein the ESD transistor comprises the source, the drain, and the gate.

13. The integrated circuit of claim 12 further comprising:
    a base well defined within the substrate, wherein the channel is defined within the base well.

14. The integrated circuit of claim 13 further comprising a ground region in electrical communication with the base well.

15. The integrated circuit of claim 12 wherein the Schottky portion has a Schottky length of from about 0.1 to about 0.5 microns.

16. A method of producing an integrated circuit comprising:
    forming a gate overlying a substrate, wherein a channel is defined within the substrate directly underlying the gate;

forming a source and a drain within the substrate on opposite sides of the gate, wherein a Schottky portion of the substrate is positioned between the gate and the source; and forming a Schottky contact in electrical communication with the Schottky portion.

17. The integrated circuit of claim 16 further comprising:

forming a base well in the substrate, wherein the channel is defined within the base well.

18. The integrated circuit of claim 16 further comprising forming a source contact in electrical communication with the source, wherein the source contact and the Schottky contact are in electrical communication.

19. The integrated circuit of claim 17 further comprising forming a ground region within the substrate, wherein the ground region is in electrical communication with the base well.

* * * * *